(12) United States Patent
Tsai et al.

(10) Patent No.: US 9,565,778 B2
(45) Date of Patent: Feb. 7, 2017

(54) DISPLAY DEVICE

(71) Applicant: InnoLux Corporation, Miao-Li County (TW)

(72) Inventors: Kun-Sheng Tsai, Miao-Li County (TW); Ying-Tong Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 151 days.

(21) Appl. No.: 14/493,424

(22) Filed: Sep. 23, 2014

(65) Prior Publication Data

US 2015/0109742 A1   Apr. 23, 2015

(30) Foreign Application Priority Data

Oct. 22, 2013 (TW) .............................. 102138013 A

(51) Int. Cl.
  *H05K 5/00* (2006.01)
  *H05K 5/03* (2006.01)
  *G02F 1/1333* (2006.01)
(52) U.S. Cl.
  CPC ....... *H05K 5/0017* (2013.01); *G02F 1/133308* (2013.01); *H05K 5/03* (2013.01); *G02F 2001/133314* (2013.01); *G02F 2202/28* (2013.01)
(58) Field of Classification Search
  CPC ... H05K 5/0017; H05K 5/03; G02F 1/133308; G02F 2202/28; G02F 2001/133314
  See application file for complete search history.

(56) References Cited

U.S. PATENT DOCUMENTS

| 2009/0128733 A1* | 5/2009 | Teramoto .......... G02F 1/133308 349/60 |
| 2013/0242483 A1* | 9/2013 | Hirasawa .......... G02F 1/133308 361/679.01 |
| 2014/0055975 A1* | 2/2014 | Gu ....................... H05K 5/0017 361/807 |

FOREIGN PATENT DOCUMENTS

| CN | 103309063 | 9/2013 |
| TW | 201028763 | 8/2010 |

OTHER PUBLICATIONS

Wikipedia Definition of "polyethylene terephthalate".*
Taiwanese language office action dated Apr. 28, 2015, issued in application No. 102138013.

* cited by examiner

*Primary Examiner* — Timothy Thompson
*Assistant Examiner* — Ahmad D Barnes
(74) *Attorney, Agent, or Firm* — McClure, Qualey & Rodack, LLP

(57) ABSTRACT

A display device is provided, including a display panel, a back frame, a circuit board and a cover film. The display panel includes a first substrate and a second substrate, wherein the first substrate includes an upper surface. The back frame supports the display panel and includes an outer surface. The cover film includes a film base, a first adhesive and a second adhesive. The film base includes a first portion, a second portion and an intermediate portion located therebetween, wherein the film base covers an edge of the upper surface and a portion of the outer surface. The first adhesive is disposed on the first portion and is attached to the edge of the upper surface. The second adhesive is disposed on the second portion and is attached to the outer surface, wherein the intermediate portion and the outer surface define a receiving space receiving the circuit board.

20 Claims, 5 Drawing Sheets

DISPLAY DEVICE

CROSS REFERENCE TO RELATED APPLICATIONS

This Application claims priority of Taiwan Patent Application No. 102138013, filed on Oct. 22, 2013, the entirety of which is incorporated by reference herein.

BACKGROUND OF THE INVENTION

Field of the Invention

The present invention relates to a display device, and in particular to a display device utilized in thin electronic equipment.

Description of the Related Art

To satisfy the requirements on thin electronic equipment, common display devices omit the front frame, and the panel, the plastic frame and the back frame are fixed by gummed tape. However, improper tape attachment may cause uneven attachment, and the tape can easily become detached. Additionally, the gummed tape may be attached to the circuit board, and cannot be reworked.

BRIEF SUMMARY OF THE INVENTION

A display device is provided. The display device includes a display panel, a back frame, a circuit board and a cover film. The display panel includes a first substrate and a second substrate, wherein the first substrate includes an upper surface. The back frame supports the display panel and comprises an outer surface. The circuit board is electrically connected to the display panel. The cover film includes a film base, a first adhesive and a second adhesive. The film base includes a first portion, a second portion and an intermediate portion located between the first portion and the second portion, wherein the film base covers an edge of the upper surface, a portion of the outer surface and the circuit board. The first adhesive is disposed on the first portion and is attached to the edge of the upper surface. The second adhesive is disposed on the second portion and is attached to the outer surface, wherein the intermediate portion and the outer surface define a receiving space, and the circuit board is received in the receiving space.

Utilizing the display device of the embodiment of the invention, the elements thereof can be properly fixed, and the reworking problem due to the tape being attached to the circuit board is prevented.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
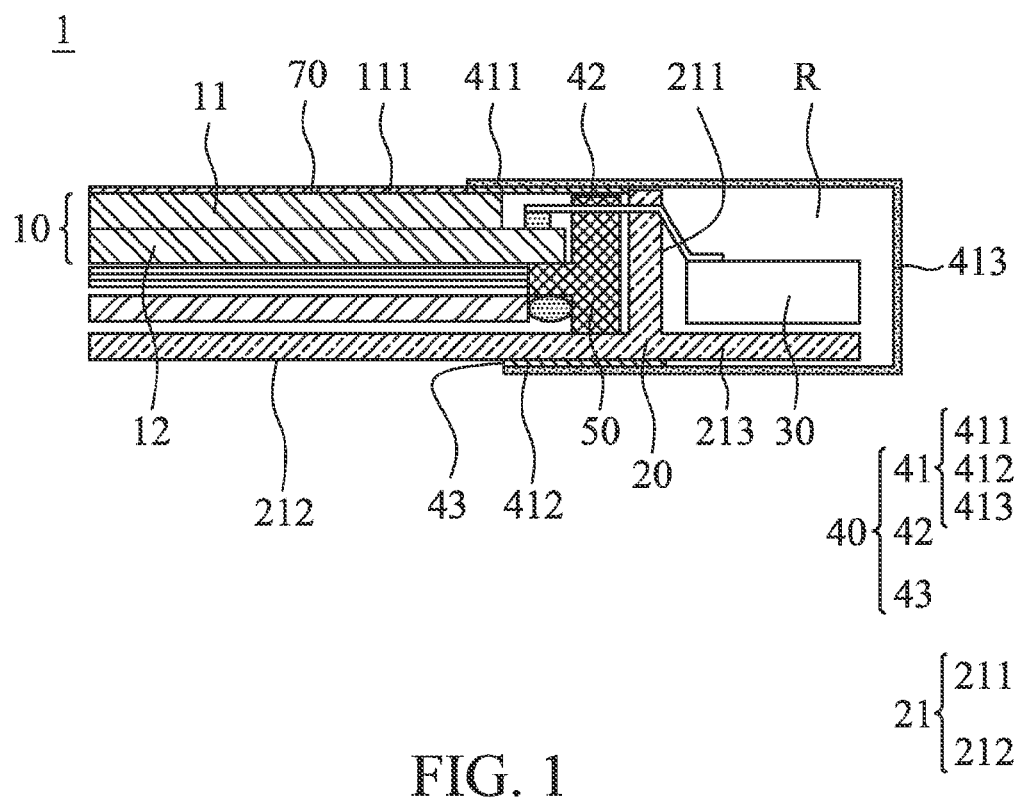
FIG. 1 shows the display device of an embodiment of the invention.

FIG. 1 shows a display device 1 of an embodiment of the invention, comprising a display panel 10, a back frame 20, a circuit board 30 and a cover film, 40. The display panel 10 comprises a first substrate 11 and a second substrate 12, wherein the first substrate 11 comprises an upper surface 111. The back frame 20 supports the display panel 10 and comprises an outer surface 21. The circuit board 30 is electrically connected to the display panel 10. The cover film 40 comprises a film base 41, a first adhesive 42 and a second adhesive 43. The film base 41 comprises a first portion 411, a second portion 412 and an intermediate portion 413 located between the first portion 411 and the second portion 412. The film base 41 covers an edge of the upper surface 111, a portion of the outer surface 21 and the circuit board 30. The first adhesive 42 is disposed on the first portion 411 and is attached to the edge of the upper surface 111. The second adhesive 43 is disposed on the second portion 412 and is attached to the outer surface 21, wherein the intermediate portion 413 and the outer surface 21 define a receiving space R, and the circuit board 30 is received in the receiving space R.

Figure 2:
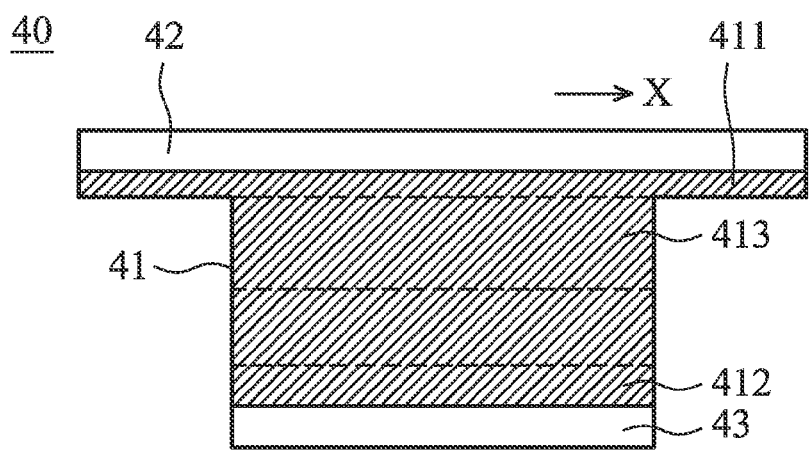
FIG. 2 shows the detailed structure of the cover film of the embodiment of the invention.

FIG. 2 shows detailed structure of the cover film 40, wherein a length of the first adhesive 42 in a first direction X is longer than a length of the second adhesive 43 in the first direction X. A length of the first portion 411 in the first direction X is longer than a length of the second portion 412 in the first direction X. The adhesive ability of the intermediate portion 413 differs from an adhesive ability of the first portion 411, and the adhesive ability of the intermediate portion 413 differs from an adhesive ability of the second portion 412. In one embodiment of the invention, no adhesive is attached to the intermediate portion 413. Therefore, the adhesive ability of the intermediate portion 413 is poorer than the adhesive ability of the first portion 411, and the adhesive ability of the intermediate portion 413 is poorer than the adhesive ability of the second portion 412.

Figure 3A:
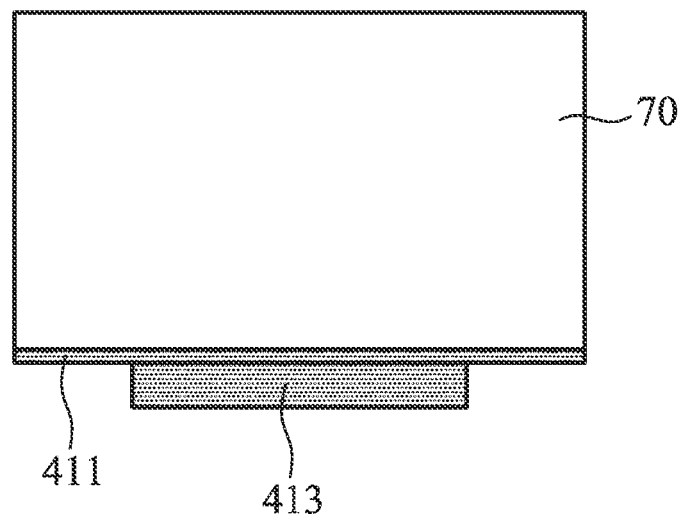
FIG. 3A shows the top view of the display device of the embodiment of the invention.
Figure 3B:
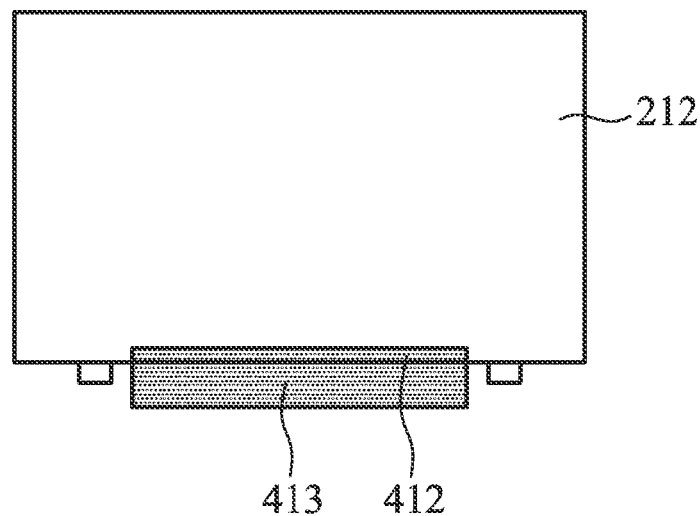
FIG. 3B shows the bottom view of the display device of the embodiment of the invention.

FIGS. 3A and 3B show a top view and a bottom view of the display device 1. With reference to FIGS. 1 and 3B, the outer surface 21 comprises a lateral side 211 and a bottom side 212, and the second adhesive 43 is attached to the bottom side 212 of the outer surface 21.

With reference to FIG. 1, the first adhesive 42 is partially between the film base 41 and the upper surface 111. The second adhesive 43 is located between the film base 41 and the bottom side 212.

With reference to FIG. 1, the receiving space R is formed by the intermediate portion 413 and the lateral side 211. A rib 213 is formed on the lateral side 211, and the circuit board 30 is disposed on the rib 213. The rib 213 and the circuit board 30 are located in the receiving space R. The rib 213 can be integrally formed on the lateral side 211.

Utilizing the display device of the embodiment of the invention, the elements thereof can be properly fixed, and the reworking problem due to the tape being attached to the circuit board is prevented.

Figure 4:
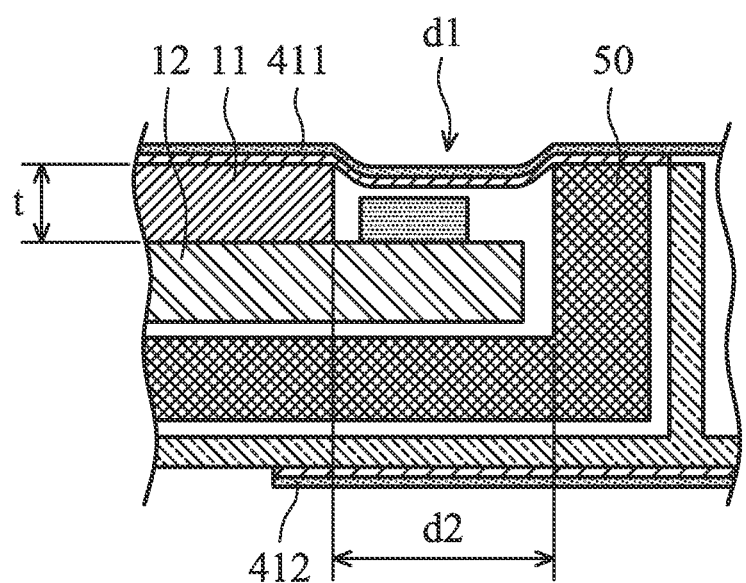
FIG. 4 is an enlarged view of the display device of the embodiment of the invention.

With reference to FIG. 1, in one embodiment, the display device 1 further comprises a plastic frame 50 located between the display panel 10 and the back frame 20. With reference to FIG. 4, a width d1 of the cover film 40 between the first substrate 11 and the plastic frame 50 is shorter than a sum of the a distance d2 between the first substrate 11 and the plastic frame 50 and double a thickness t of the first substrate 11. Therefore, the welding or integrated circuit below the panel can be protected, and the circuits on the left and right sides can also be protected.

Figure 5A:
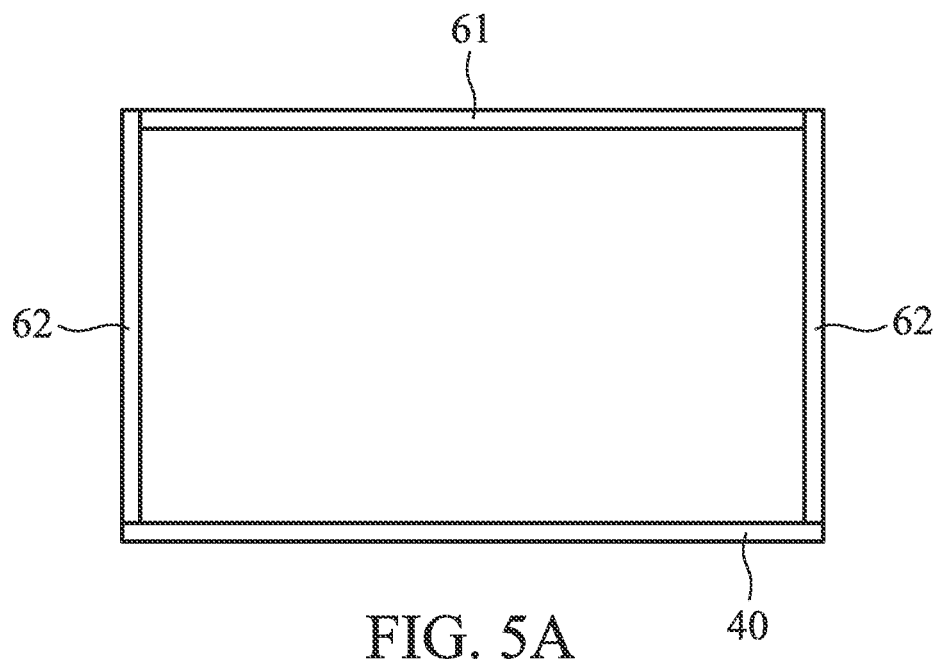
FIGS. 5A and 5B show the gummed tape attached to the display device of the embodiment of the invention.
Figure 5B:
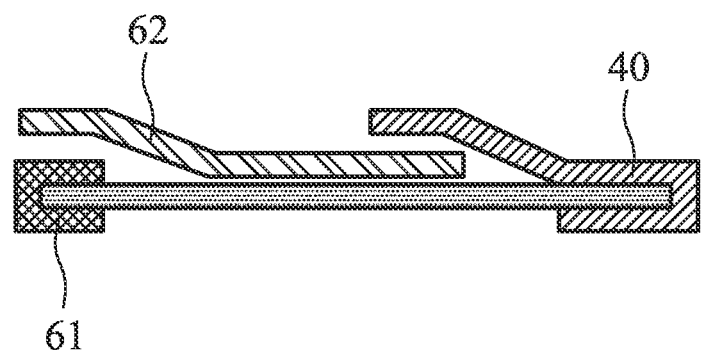

With reference to FIG. 5A, in one embodiment, the display device 1 further comprises a first gummed tape 61 and a second gummed tape 62, which cover and are attached to the outer surface 21 and other edges of the upper surface 111. With reference to FIG. 5B, in one embodiment, an end of the second gummed tape 62 is attached to the first gummed tape 61, and the cover film 40 is attached to the other end of the second gummed tape 62 to prevent the second gummed tape 62 from easily becoming detached.

Figure 6:
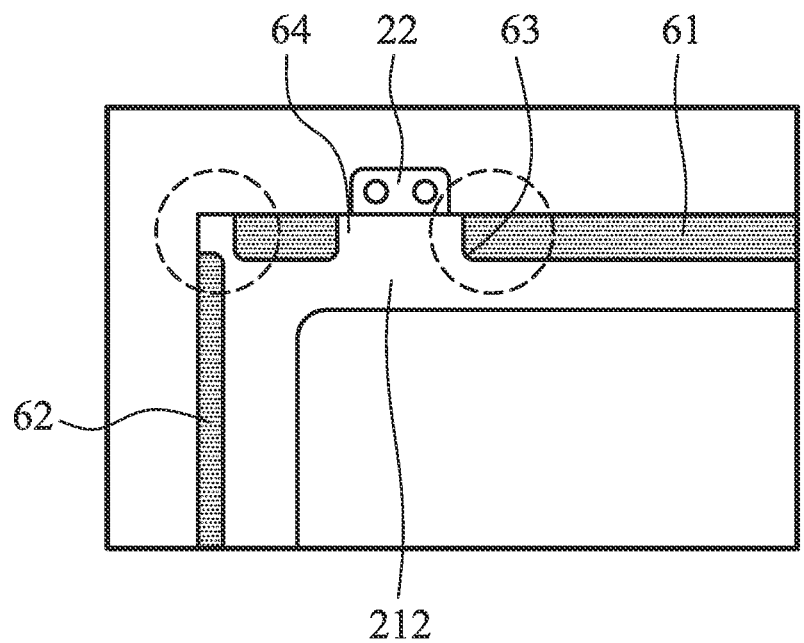
FIG. 6 shows the detailed structure of the gummed tape of the embodiment of the invention.

With reference to FIG. 6, in one embodiment, a plurality of lead angle structures 63 are formed on the ends of the first gummed tape 61, the second gummed tape 62 and the cover film 40. The lead angle structures 63 are located on the bottom side 212. The back frame 20 further comprises a plurality of protrusions 22 formed on the lateral side. A plurality of notches 64 are formed on the first gummed tape 61, the second gummed tape 62 and the cover film 40 corresponding to the protrusions 22. Each notch 64 has a length, and the length of each notch 64 is greater than a length of each protrusion 22. Thus, the attachment of the first and the second gummed tape can be smoother.

In one embodiment, the a width of the cover film 40, the first gummed tape 61 and second gummed tape 62 attached to the upper surface 111 differs from a width of the cover film 40, the first gummed tape 61 and second gummed tape 62 attached to the bottom side 212. Therefore, the integrated circuit and the wire can be protected, or the width of the frame can be decreased.

With reference to FIG. 1, in one embodiment, the display device 1 further comprises a polarizing film 70, wherein a width of the cover film 40, the first gummed tape 61 and second gummed tape 62 attached to the upper surface 111 is shorter than or equal to a horizontal distance between an edge of the polarizing film 70 and an edge of the first substrate 11.

Figure 7:
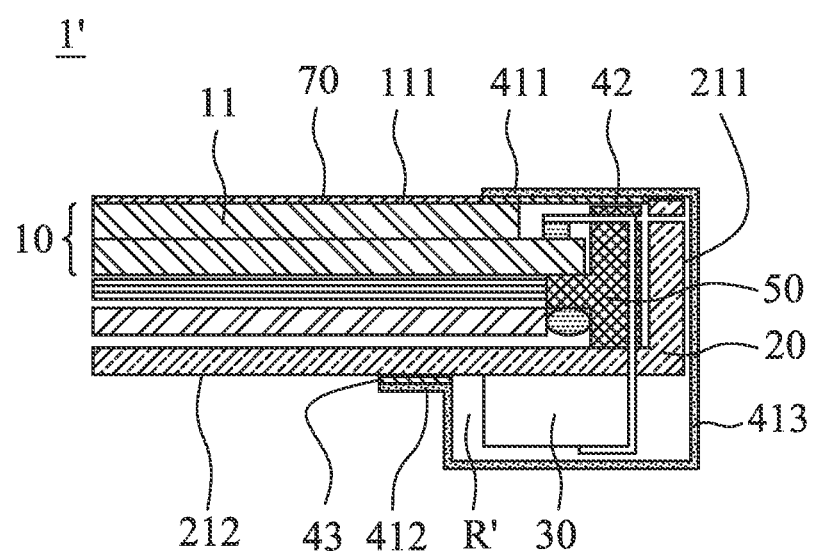
FIG. 7 shows the display device of another embodiment of the invention.

FIG. 7 shows a display device 1' of another embodiment of the invention, wherein the receiving space R' is formed by the intermediate portion 413 and the bottom side 212. In this embodiment, the circuit board 30 is disposed on the bottom side 212.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
    a display panel, comprising a first substrate and a second substrate, wherein the first substrate comprises an upper surface and a lateral surface perpendicular to the upper surface;
    a back frame, supporting the display panel and comprising an outer surface, wherein the outer surface comprises a lateral side and a bottom side;
    a circuit board, electrically connected to the display panel; and
    a cover film, comprising:
    a film base, comprising a first portion, a second portion and an intermediate portion located between the first portion and the second portion, wherein the film base covers an edge of the upper surface, a portion of the outer surface and the circuit board;
    a first adhesive, disposed on the first portion and attached to the edge of the upper surface; and
    a second adhesive, disposed on the second portion and attached to the outer surface, wherein the intermediate portion and the lateral side define a receiving space, and the circuit board is received in the receiving space, and the lateral side is between the lateral surface and the circuit board.

2. The display device as claimed in claim 1, wherein an adhesive ability of the intermediate portion differs from an adhesive ability of the first portion, and the adhesive ability of the intermediate portion differs from an adhesive ability of the second portion.

3. The display device as claimed in claim 1, wherein an adhesive ability of the intermediate portion is poorer than an adhesive ability of the first portion, and the adhesive ability of the intermediate portion is poorer than an adhesive ability of the second portion.

4. The display device as claimed in claim 1, wherein a length of the first adhesive in a first direction is longer than a length of the second adhesive in the first direction.

5. The display device as claimed in claim 1, wherein the first adhesive is partially disposed between the film base and the upper surface.

6. The display device as claimed in claim 1, wherein the outer surface comprises a lateral side and a bottom side, and the second adhesive is attached to the bottom side.

7. The display device as claimed in claim 6, wherein the second adhesive is disposed between the film base and the bottom side.

8. The display device as claimed in claim 6, wherein the receiving space is formed by the intermediate portion and the lateral side.

9. The display device as claimed in claim 6, wherein the receiving space is formed by the intermediate portion and the bottom side.

10. The display device as claimed in claim 6, further comprising a first gummed tape and a second gummed tape, covering and attached to the outer surface and other edges of the upper surface.

11. The display device as claimed in claim 10, wherein an end of the second gummed tape is attached to the first gummed tape, and the cover film is attached to the other end of the second gummed tape.

12. The display device as claimed in claim 10, wherein a plurality of lead angle structures are formed on ends of the first or second gummed tape, and the lead angle structures are located on the bottom side.

13. The display device as claimed in claim 10, wherein the back frame comprises a plurality of protrusions formed on the lateral side.

14. The display device as claimed in claim 13, wherein the first or second gummed tape has a plurality of notches corresponding to the protrusions, and a length of each notch is greater than a length of each protrusion.

15. The display device as claimed in claim 10, wherein a width of the cover film, the first gummed tape and second gummed tape attached to the upper surface differs from a width of the cover film, the first gummed tape and second gummed tape attached to the bottom side.

16. The display device as claimed in claim 10, further comprising a polarizing film, wherein a width of the cover film, the first gummed tape and second gummed tape attached to the upper surface is shorter than or equal to a horizontal distance between an edge of the polarizing film and an edge of the first substrate.

17. The display device as claimed in claim 1, wherein no adhesive is attached to the intermediate portion.

18. The display device as claimed in claim 1, comprising a plastic frame, located between the display panel and the back frame.

19. The display device as claimed in claim 18, wherein a width of the cover film between the first substrate and the plastic frame is shorter than a sum of the a distance between the first substrate and the plastic frame and double a thickness of the first substrate.

20. A display device, comprising:
   a display panel, comprising a first substrate and a second substrate, wherein the first substrate comprises an upper surface, a long edge and a short edge, and a length of the long edge is longer than a length of the short edge;
   a back frame, supporting the display panel and comprising an outer surface;
   a circuit board, electrically connected to the display panel; and
   a cover film, comprising:
   a film base, comprising a first portion, a second portion and an intermediate portion located between the first portion and the second portion, wherein the film base covers an edge of the upper surface, a portion of the outer surface and the circuit board;
   a first adhesive, disposed on the first portion and attached to the long edge; and
   a second adhesive, disposed on the second portion and attached to the outer surface, wherein a length of the first portion in a first direction is longer than a length of the second portion in the first direction, and the first direction is parallel to the long edge.

* * * * *